(12) United States Patent
Jeon et al.

(10) Patent No.: US 7,085,158 B2
(45) Date of Patent: Aug. 1, 2006

(54) NONVOLATILE SEMICONDUCTOR MEMORY DEVICE AND ONE-TIME PROGRAMMING CONTROL METHOD THEREOF

(75) Inventors: Byung-Gil Jeon, Suwon (KR); Byung-Jun Min, Yongin (KR)

(73) Assignee: Samsung Electronics, Co., Ltd., Suwon-si (KR)

( * ) Notice: Subject to any disclaimer, the term of this patent is extended or adjusted under 35 U.S.C. 154(b) by 182 days.

(21) Appl. No.: 10/787,369

(22) Filed: Feb. 26, 2004

(65) Prior Publication Data

US 2005/0013162 A1    Jan. 20, 2005

(30) Foreign Application Priority Data

Jul. 14, 2003    (KR) ...................... 10-2003-0048081

(51) Int. Cl.
  G11C 11/34  (2006.01)
  G11C 17/00  (2006.01)
(52) U.S. Cl. .............................. 365/185.04; 365/225.7; 365/230.06
(58) Field of Classification Search ........... 365/185.04, 365/150, 189.01, 201, 218, 230.06, 230.05, 365/185.01, 225.7
See application file for complete search history.

(56) References Cited

U.S. PATENT DOCUMENTS

| | | | | |
|---|---|---|---|---|
| 5,991,197 A * | 11/1999 | Ogura et al. ........... | 365/185.11 |
| 6,421,799 B1 * | 7/2002 | Ferrant ....................... | 714/718 |
| 6,469,928 B1 * | 10/2002 | Takata .................... | 365/185.04 |
| 6,490,197 B1 * | 12/2002 | Fasoli ................... | 365/185.04 |
| 6,711,055 B1 * | 3/2004 | Kawamata ............. | 365/185.04 |
| 6,882,577 B1 * | 4/2005 | Chiu et al. ............. | 365/189.01 |
| 6,975,547 B1 * | 12/2005 | Byeon et al. ............... | 365/195 |
| 2005/0177679 A1 * | 8/2005 | Alva et al. ................... | 711/104 |
| 2005/0268086 A1 * | 12/2005 | Kim .............................. | 713/2 |

OTHER PUBLICATIONS

TechWeb definition of Parity Checking (n.d.). Retrieved Nov. 18, 2005 from http://www.techweb.com/encyclopedia/printArticlePage.jhtml?term=parity+checking.*
TechWeb definition of Parity Bit (n.d.). Retrieved Nov. 18, 2005 from http://www.techweb.com/encyclopedia/printArticlePage.jhtml?term=parity+bit.*

* cited by examiner

*Primary Examiner*—Tuan T. Nguyen
*Assistant Examiner*—Alexander Sofocleous
(74) *Attorney, Agent, or Firm*—F. chau &Associates, LLC

(57) ABSTRACT

A nonvolatile semiconductor memory device is provided, comprising a nonvolatile memory cell array which has a one-time programming region accessed in response to a first decoding signal and a normal region accessed in response to a second decoding signal. The device performs a read operation and a write operation. The device further comprises (a) a data write circuit writing data in the nonvolatile memory cell array in response to a write enable signal during the write operation; (b) a data read circuit reading data output from the nonvolatile memory cell array in response to a sense amplifier enable signal during the read operation; and (c) a control means activating the sense amplifier enable signal when the first decoding signal is generated and comparing data output from the data read circuit to generate the write enable signal during the write operation.

23 Claims, 6 Drawing Sheets

NONVOLATILE SEMICONDUCTOR MEMORY DEVICE AND ONE-TIME PROGRAMMING CONTROL METHOD THEREOF

BACKGROUND OF THE INVENTION

1. Field of the Invention

The present invention relates to nonvolatile semiconductor memory, and, more particularly, to a nonvolatile semiconductor memory device and a one-time programming control method thereof which do not need to perform an erase operation.

2. Description of Related Art

In general, nonvolatile semiconductor memory devices such as EEPROMs and flash memories perform a write operation, an erase operation, and a read operation. Of these, the erase operation is performed to write new data in the programmed memory cells.

Occasionally, designing a system using a nonvolatile semiconductor memory device involves setting and designing a one-time programming region on the nonvolatile semiconductor memory device. Data recorded in the one-time programming region is protected and can never be changed. The term "inherent data" will be used hereinafter to refer to data recorded in the one-time programming region. A nonvolatile memory cell array of the nonvolatile semiconductor memory device is divided into the one-time programming region and a normal region. The erase operation is designed such that it cannot be performed on data recorded in the one-time programming region.

New nonvolatile semiconductor memory devices such as ferro-electric RAM (FRAM), Phase-Change RAM (PRAM), and magnetic RAM (MRAM) do not need to perform an erase operation, and, thus, there is a need for a new method for maintaining data recorded in the one-time programming region.

SUMMARY OF THE INVENTION

In one aspect of the present invention, a nonvolatile semiconductor memory device is provided. The nonvolatile semiconductor memory device comprises: a nonvolatile memory cell array having a one-time programming region accessed in response to a first decoding signal and a normal region accessed in response to a second decoding signal, wherein the nonvolatile memory cell array performs a read operation and a write operation; a data write circuit writing data in the nonvolatile memory cell array in response to a write enable signal during the write operation; a data read circuit reading data output from the nonvolatile memory cell array in response to a sense amplifier enable signal during the read operation; and a controller for activating the sense amplifier enable signal when the first decoding signal is generated and comparing data output from the data read circuit to generate the write enable signal during the write operation.

The controller includes a program detecting circuit comparing data output from the data read circuit in response to a control signal to generate a comparison detecting signal; and a control means for inactivating the control signal when a specific mode signal is activated, activating the control signal and the sense amplifier enable signal when the specific mode signal is inactivated and the first decoding signal is generated, and activating the write enable signal when the comparison detecting signal is activated during the write operation.

In a second aspect of the present invention, a nonvolatile semiconductor memory device is provided. The nonvolatile semiconductor memory device comprises: a nonvolatile memory cell array which has a one-time programming region and a lock bit region accessed in response to a first decoding signal and a normal region accessed in response to a second decoding signal, wherein the nonvolatile memory cell array performs a read operation and a write operation; a data write circuit writing data in the nonvolatile memory cell array in response to a write enable signal during the write operation; a data read circuit reading data output from the nonvolatile memory cell array in response to a sense amplifier enable signal during the read operation; and a controller for, during the write operation, activating the sense amplifier enable signal when the first decoding signal is generated, comparing data of the lock bit region output from the data read circuit to generate a first comparison detecting signal, comparing data of the one-time programming region output from the data read circuit to generate a second comparison detecting signal in response to a second comparison detecting signal, and generating the write enable signal in response the first and second comparison detecting signals.

The nonvolatile memory cell array synchronously outputs data of the lock bit region when data of the one-time programming region is read. The controller includes a first program detecting circuit enabled in response to a first control signal to compare data of the lock bit region output from the data read circuit to thereby generate the first comparison detecting signal; a second program detecting circuit enabled in response to a second control signal to compare data output from the data read circuit to thereby generate the second comparison detecting signal; and a control means for, during the write operation, inactivating the first and second control signals when a specific mode signal is activated, activating the first and second control signals and the sense amplifier enable signal when the specific mode signal is inactivated and the first decoding signal is generated, and activating the write enable signal when the first and second comparison detecting signals are activate.

In a third aspect of the present invention, a one-time programming control method of a nonvolatile semiconductor memory device having a nonvolatile memory cell array which is divided into a one-time programming region and a normal region, wherein the nonvolatile semiconductor memory device performs a read operation and a write operation is provided. The method comprises: determining whether the one-time programming region is accessed during the write operation; comparing data read from the one-time programming region to generate a comparison detecting signal when the one-time programming region is accessed, stopping the write operation when the comparison detecting signal is not activated, and writing data in the one-time programming region when the one-time programming region is not accessed or the comparison detecting signal is activated.

In a fourth aspect of the present invention, a one-time programming control method of a nonvolatile semiconductor memory device having a nonvolatile memory cell array which is divided into one-time programming region, a lock bit region and a normal region, wherein the nonvolatile semiconductor memory device performs a read operation and a write operation is provided. The method comprises: determining whether the one-time programming region is accessed during the write operation; comparing data read from the lock bit region to generate a first comparison detecting signal when the one-time programming region and the lock bit region are accessed, and comparing data read from the one-time programming region to generate a second comparison detecting signal when the first comparison detecting signal is generated; stopping the write operation when the first or the second comparison detecting signal is not activated; and writing data in the one-time programming region when the one-time programming region and the lock bit region are not accessed or the second comparison detecting signal is activated.

BRIEF DESCRIPTION OF THE DRAWINGS

For a more complete understanding of the embodiments of the present invention, reference is now made to the following descriptions taken in conjunction with the accompanying drawings, in which like reference numerals denote like parts, and in which.

DETAILED DESCRIPTION OF THE PREFERRED EMBODIMENTS

Preferred embodiments of the present invention will now be described in detail with reference to the accompanying drawings.

Figure 1:
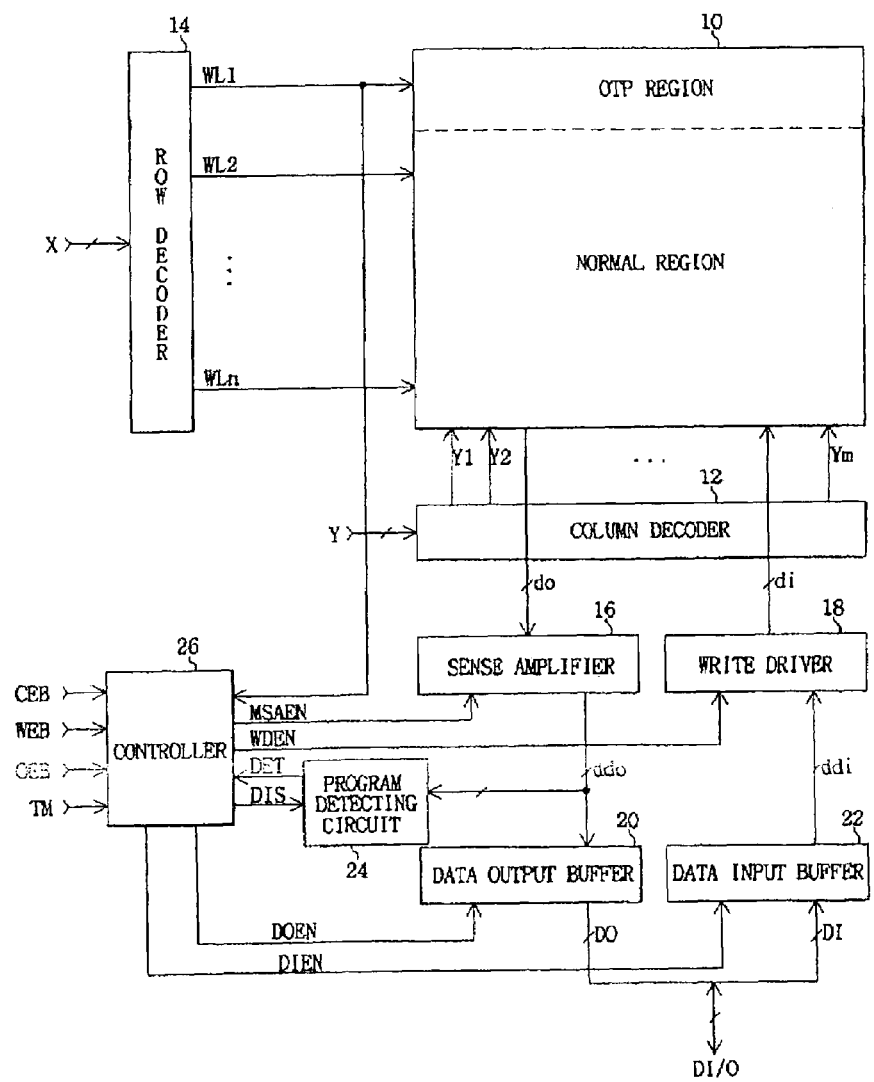
FIG. 1 is a block diagram illustrating a nonvolatile semiconductor memory device according to an embodiment of the present invention.

FIG. 1 is a block diagram illustrating a nonvolatile semiconductor memory device according to an embodiment of the present invention. The nonvolatile semiconductor memory device of FIG. 1 includes a nonvolatile memory cell array 10, a column decoder 12, a row decoder 14, a sense amplifier 16, a write driver 18, a data output buffer 20, a data input buffer 22, a program detecting circuit 24, and a controller 26.

Functions of the above-referenced components of the nonvolatile semiconductor memory device of FIG. 1 are explained below.

The nonvolatile memory cell array 10 includes a one-time programming ("OTP") region and a normal region. Data can be written to the OTP region only one time and is accessed by a word line selecting signal WL1. Data written to the normal region may be written or read repeatedly and accessed by word line selecting signals WL2 to WLn. The column decoder 12 decodes a column address Y to generate column selecting signals Y1 to Ym. The row decoder 14 decodes a row address X to generate the word line selecting signals WL1 to WLn. The sense amplifier 16 amplifies a signal "do" output from the nonvolatile memory cell array 10 and generates amplified data "ddo" in response to a sense amplifier enable signal MSAEN. The write driver 18 writes buffered data "ddi" in the nonvolatile memory cell array 10 in response to a write driver enable signal WDEN. The data output buffer 20 buffers the amplified data "ddo" to generate output data DO in response to a data output enable signal DOEN. The data input buffer 22 buffers input data DI to generate to the buffered data "ddi" in response to a data input enable signal DIEN. The program detecting circuit 24 compares the amplified data "ddo" to generate a comparison detecting signal DET in response to a signal DIS. The controller 26 is enabled when an inverted chip enable signal CEB having a logic "low" level is applied. The controller 26 activates the sense amplifier enable signal MSAEN for a read operation when an inverted write enable signal WEB having a logic "high" level is applied. The controller 26 activates the data output enable signal DOEN when an inverted output enable signal OEB having a logic "low" level is applied. Also, the controller 26 inactivates the signal DIS when the inverted write enable signal WEB having a logic "low" level and a specific mode signal TM having a logic "low" level are applied. The controller 26 activates the data input enable signal DIEN and the sense amplifier enable signal MSAEN when the inverted write enable signal WEB having a logic "low" level, the specific mode signal TM having a logic "high" level, and the word line selecting signal WL1 are applied. The controller 26 activates the write driver enable signal WDEN in response to the comparison detecting signal DET.

The nonvolatile semiconductor memory device of FIG. 1 detects whether the OTP region of the nonvolatile memory cell array 10 is programmed during a write operation by the program detecting circuit 24. Inherent data is written to the OTP region if data is not recorded in the OTP region. Inherent data cannot be written in the OTP region if data is already recorded.

Figure 2:
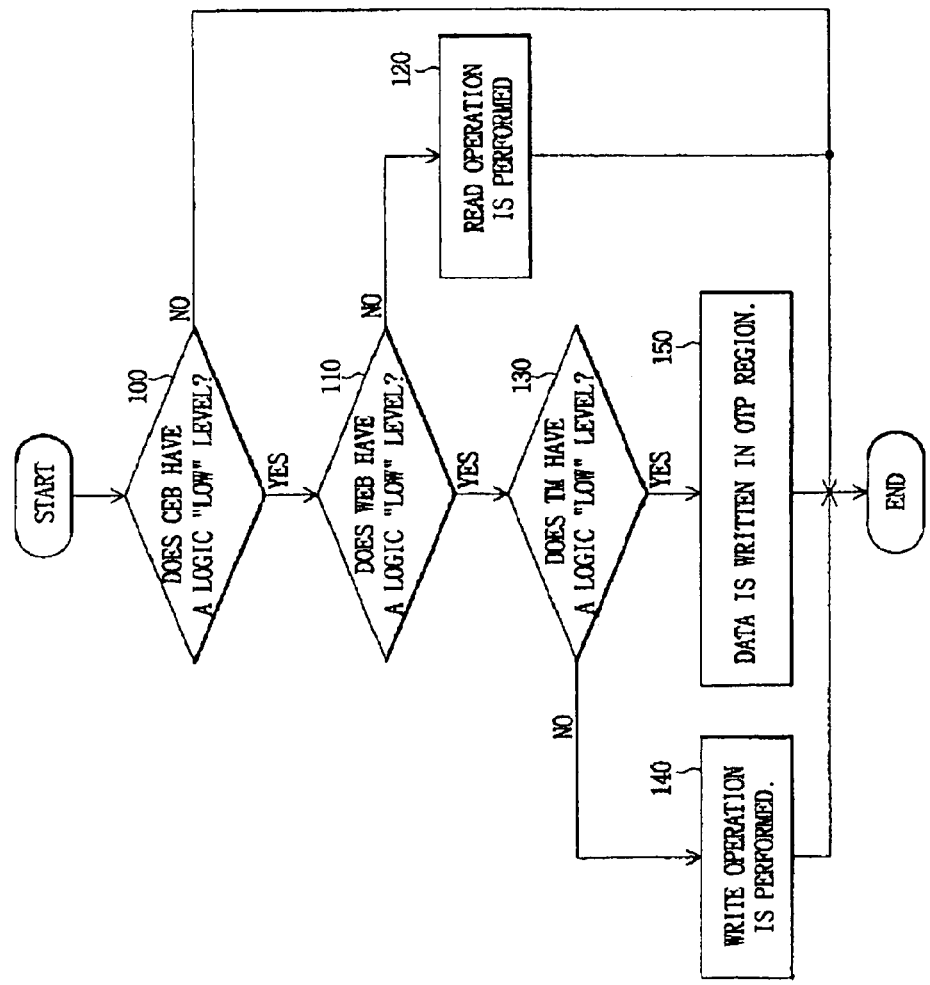
FIG. 2 is a flow chart illustrating a method of writing data in the one-time programming region of the nonvolatile semiconductor memory device of FIG. 1.

FIG. 2 is a flow chart illustrating a method of writing data in the one-time programming region of the nonvolatile semiconductor memory device of FIG. 1.

First, a semiconductor manufacturer applies the inverted chip enable signal CEB having a logic "low" level to the nonvolatile semiconductor memory device (step 100), whereby an operation of the nonvolatile semiconductor memory device is enabled.

Next, the semiconductor manufacturer applies the inverted write enable signal WEB having a logic "low" level to the nonvolatile semiconductor memory device (step 110). When the inverted write enable signal WEB having a logic "low" level is applied, the controller 26 activates a data input enable signal DIEN.

If the inverted write enable signal WEB does not have a logic "low" level, a read operation is performed (step 120). That is, when the inverted write enable signal WEB having a logic "high" level is applied, the controller 26 activates the sense amplifier enable signal MSAEN and the data output enable signal DOEN.

If the inverted write enable signal WEB having a logic "low" level is applied, it is determined whether or not a specific mode signal TM has a logic "low" level (step 130). If the specific mode signal TM has a logic "high" level, a write operation is performed (step 140). However, if the specific mode signal TM has a logic "low" level, certain data is written in the OTP region of the nonvolatile memory cell array 10 of FIG. 1 (step 150).

In more detail, the controller 26 inactivates a signal DIS in response to the specific mode signal TM having a logic "low" level. The row decoder 14 decodes a row address X to activate a word line selecting signal WL1, and the column decoder 12 decodes the column address Y to generate one of the column selecting signals Y1 to Ym to access the OTP region. The data input buffer 22 buffers and outputs externally input data, and the write driver 18 applies the buffered data to the nonvolatile memory cell array 10, whereby certain data is written in the OTP region of the nonvolatile memory cell array 10 of FIG. 1. By repeatedly performing the method described above while changing the column address Y, certain data is written in the OTP region of the nonvolatile memory cell array 10.

When a power voltage is applied to a power voltage applying pad after certain data is written in the OTP region of the nonvolatile memory cell array 10, a specific mode signal TM connected to the power voltage applying pad is enabled.

Figure 3:
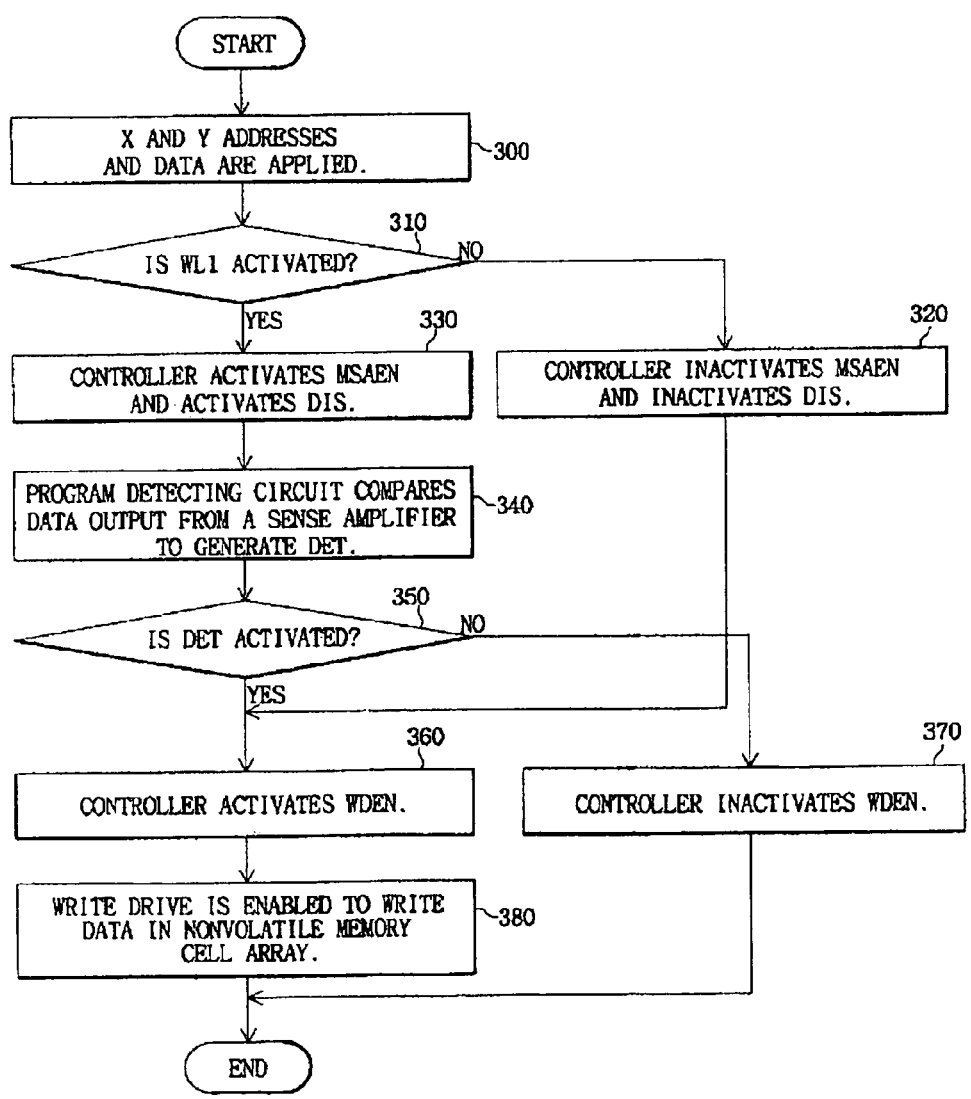
FIG. 3 is a flow chart illustrating the one-time programming control method of the nonvolatile semiconductor memory device of FIG. 1.

FIG. 3 is a flow chart illustrating the one-time programming control method of the nonvolatile semiconductor memory device of FIG. 1. In particular, FIG. 3 shows an operation of the step 140 of FIG. 2.

The X and Y addresses and data are inputted (step 300). The row decoder 14 decodes the row address X to select one of the word line selecting signals WL1 to WLn, and the column decoder 12 decodes the column address Y to select one of the column selecting signals Y1 to Ym.

The controller 26 determines whether the word line selecting signal WL1 is activated (step 310).

If the word line selecting signal WL1 is not activated, the controller 26 inactivates the sense amplifier enable signal MSAEN and the signal DIS in response to the word line selecting signal WL1 (step 320).

If the word line selecting signal WL1 is activated, the controller 26 activates the sense amplifier enable signal MSAEN and the signal DIS in response to the word line selecting signal WL1 (step 330).

The program detecting circuit 24 compares data "ddo" output from the sense amplifier 16 to generate the comparison detecting signal DET (step 340). The program detecting circuit 24 compares whether data "ddo" output from the sense amplifier 16, i.e., data read from the OTP region, are all "0" (or "1"). If the data are all"0" (or"1"), the program detecting circuit 24 activates a comparison detecting signal DET. In other cases, the comparison detecting signal DET is inactivated.

The controller 26 determines whether the comparison detecting signal DET is activated (step 350).

If the comparison detecting signal DET is activated, the controller 26 activates the write driver enable signal WDEN (step 360). Also, the step 360 is performed after the step 320.

On the other hand, if the comparison detecting signal DET is inactivated, the controller 26 inactivates the write driver enable signal WDEN (step 370). Subsequent to the step 360, operation of the write driver 18 is enabled, so that buffered input data "ddi" output from the data input buffer 22 is written in the nonvolatile memory cell array 10 of FIG. 1 (step 380).

In the step 300, the X and Y addresses and data are simultaneously applied, but the X and Y addresses and data can be sequentially applied.

In the embodiment described above, the nonvolatile semiconductor memory device of FIG. 1 and one-time programming control circuit activate the write driver enable signal WDEN to write data in the normal region of the nonvolatile memory cell array 10 when the normal region is selected during a write operation. When the OTP region is selected, the sense amplifier enable signal MSAEN is activated to determine whether inherent data is programmed in the OTP region, and the signal DIS is activated, so that operation of the program detecting circuit 24 is enabled. If inherent data is programmed, the controller 26 inactivates the write driver enable signal WDEN. If inherent data is not programmed, the controller 26 activates the write driver enable signal WDEN to write inherent data in the OTP region.

Figure 4:
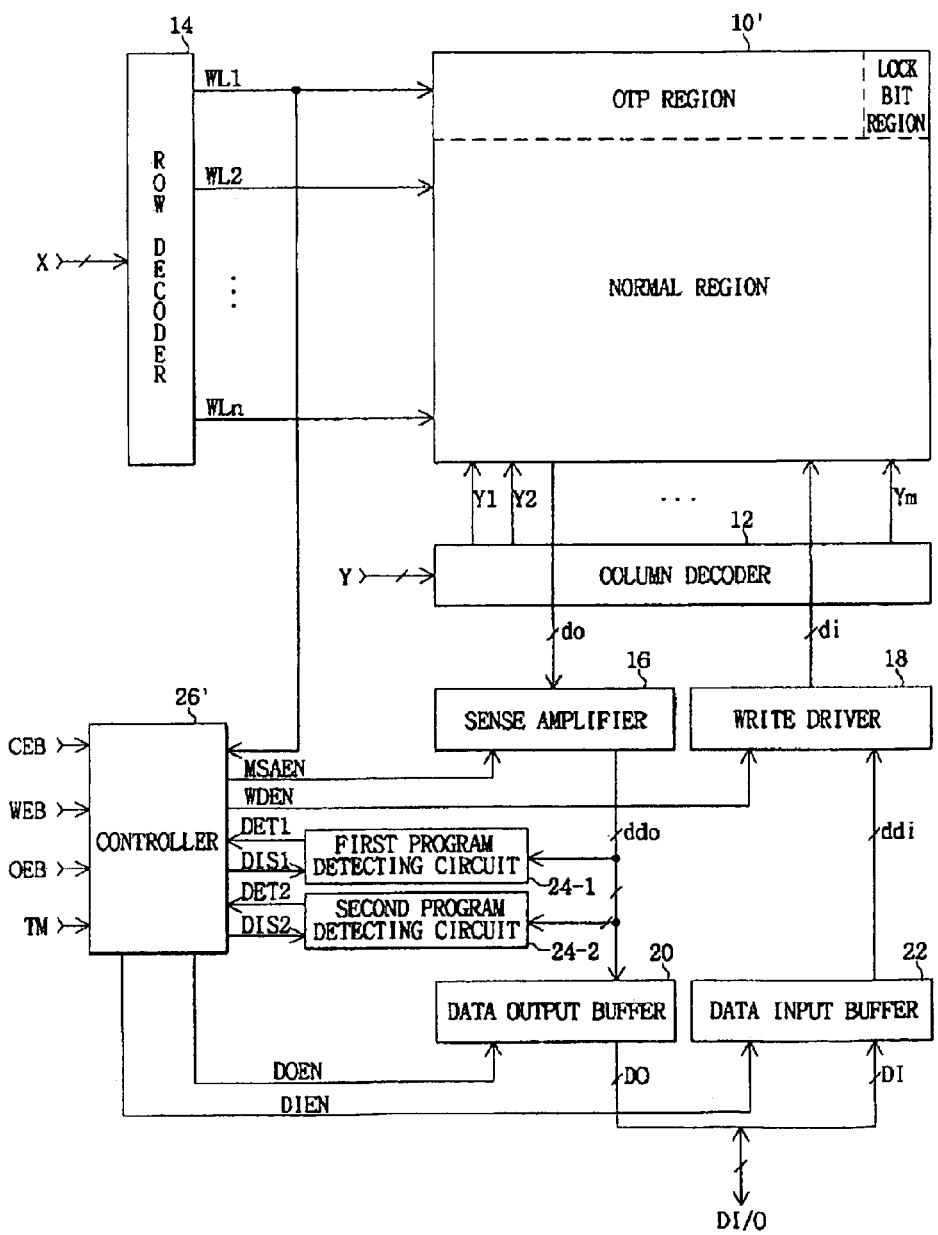
FIG. 4 is a block diagram illustrating a nonvolatile semiconductor memory device according to another embodiment of the present invention.

FIG. 4 is a block diagram illustrating a nonvolatile semiconductor memory device according to another embodiment of the present invention. The nonvolatile semiconductor memory device of FIG. 4 includes a nonvolatile memory cell array 10', a column decoder 12, a row decoder 14, a sense amplifier 16, a write driver 18, a data output buffer 20, a data input buffer 22, first and second program detecting circuits 24-1 and 24-2, and a controller 26'.

The nonvolatile semiconductor memory device of FIG. 4 has the first and second program detecting circuits 24-1 and 24-2 and the controller 26' instead of the program detecting circuit 24 and the controller 26, respectively. The nonvolatile memory cell array 10' includes a normal region, an OTP region and a lock bit region, unlike the nonvolatile memory cell array 10 of FIG. 1 having the normal region and the OTP region.

Functions of components of the nonvolatile semiconductor memory device of FIG. 4 are explained below. In FIGS. 1 and 4, like reference numerals denote like parts and perform like operations, and thus functions of added or changed components are explained below.

In the nonvolatile memory cell array 10', the one-time programming (OTP) region and the lock bit region are accessed by a word line selecting signal WL1, and the normal region is accessed by word line selecting signals WL2 to WLn. Inherent data can be programmed in the OTP region only one time. Data "0" (or "1") is written to the lock bit region when the certain data are completely stored in the OTP region.

The first program detecting circuit 24-1 is enabled in response to a signal DIS1 to detect whether data of the lock bit region output from the sense amplifier 16 is "0" (or "1") to generate a first comparison detecting signal DET1. The second program detecting circuit 24-2 is enabled in response to a signal DIS2 to detect whether data output from the sense amplifier 16 are all "0" (or "1") to generate a second comparison detecting signal DET2.

The controller 26' is enabled when an inverted chip enable signal CEB having a logic "low" level is applied. The controller 26' activates a sense amplifier enable signal MSAEN for a read operation when an inverted write enable signal WEB having a logic "high" level is applied. The controller 26' activates a data output enable signal DOEN when an inverted output enable signal OEB having a logic "low" level is applied. Also, the controller 26' inactivates signals DIS1 and DIS2 when the inverted write enable signal WEB having a logic "low" level and a specific mode signal TM having a logic "low" level are applied. The controller 26' activates a data input enable signal DIEN, the sense amplifier enable signal MSAEN and the signal DIS1 when the inverted write enable signal WEB having a logic "low" level, a specific mode signal TM, and a word line selecting signal WL1 having a logic "high" level are applied. The controller 26' activates the signal DIS2 when the signal DET1 is activated.

The nonvolatile semiconductor memory device of FIG. 4 determines whether the OTP region is programmed using data of the lock bit region to generate a first comparison detecting signal DET1, and then determines whether the OTP region is programmed using data of the OTP region to generate a second comparison detecting signal DET2. Therefore, if is determined that the OTP region has been programmed one time, a write driver enable signal WDEN is inactivated, thereby preventing data from being written in the OTP region.

Figure 5:
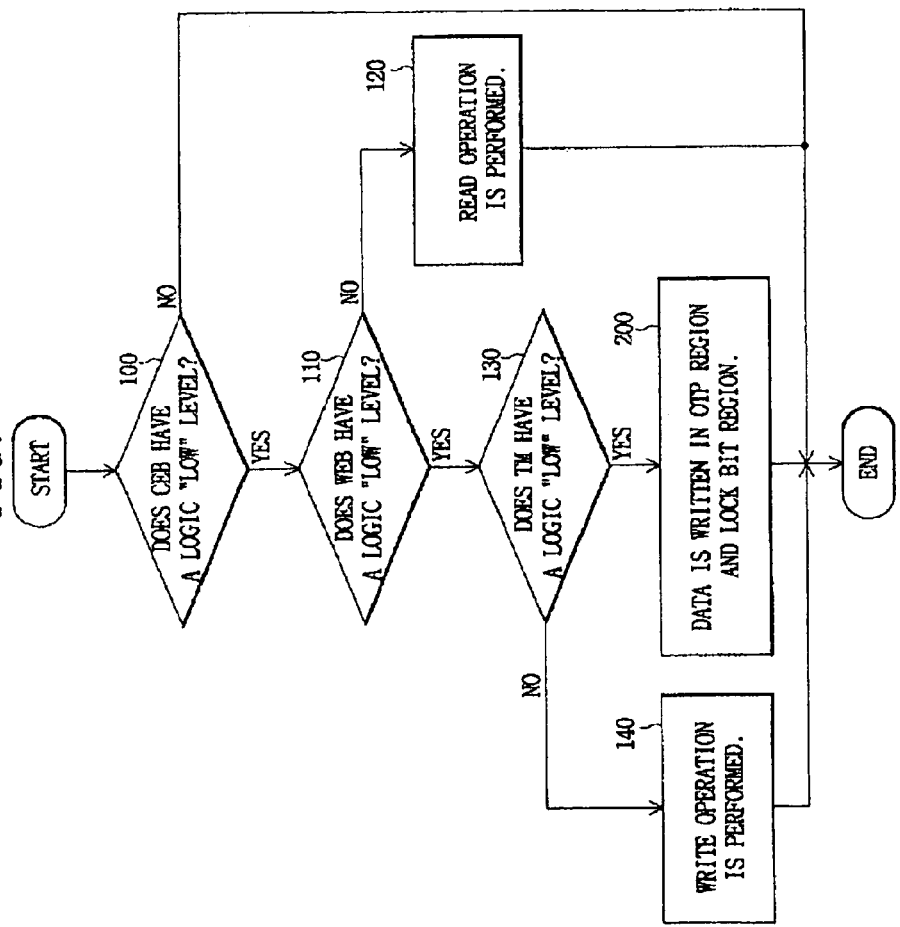
FIG. 5 is a flow chart illustrating a method of writing data in the one-time programming region of the nonvolatile semiconductor memory device of FIG. 4.

FIG. 5 is a flow chart illustrating a method of writing data in the one-time programming region of the nonvolatile semiconductor memory device of FIG. 4.

Steps of like reference numerals in FIGS. 2 and 5 perform like operations. The methods of FIGS. 2 and 5 differ in steps 150 and 200.

In the step 200, certain data is written in the OTP region of the nonvolatile memory cell array 10', and when data is completely written in the OTP region, lock data "0" (or "1") is written in the lock bit region.

That is, after the certain data "0" (or "1") is written in the OTP region of the nonvolatile memory cell array 10' by the same way as the step 150 of FIG. 2, the lock data "0" (or "1") is written in the lock bit region.

Figure 6:
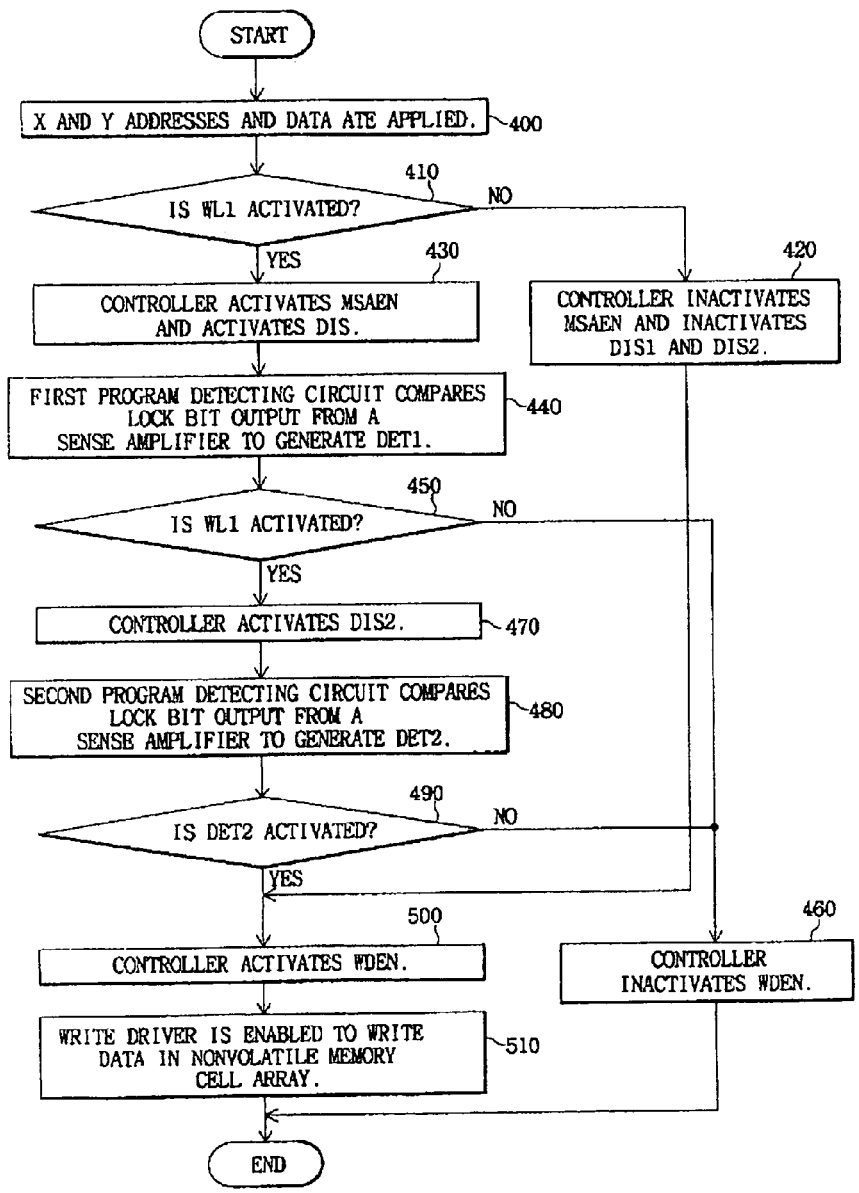
FIG. 6 is a flow chart illustrating the one-time programming control method of the nonvolatile semiconductor memory device of FIG. 4.

FIG. 6 is a flow chart illustrating a one-time programming control method of the nonvolatile semiconductor memory device of FIG. 4. In particular, FIG. 6 shows operation of the step 140 of FIG. 5.

The X and Y addresses and data are inputted (step 400). The row decoder 14 decodes the row address X to select one of the word line selecting signals WL1 to WLn, and the column decoder 12 decodes the column address Y to select one of the column selecting signals Y1 to Ym.

The controller 26' determines whether the word line selecting signal WL1 is activated (step 410).

If the word line selecting signal WL1 is not activated, the controller 26' inactivates the sense amplifier enable signal MSAEN and inactivates signals DIS1 and DIS2 (step 420).

If the word line selecting signal WL1 is activated, the controller 26' activates the sense amplifier enable signal MSAEN and activates the signal DIS1 (step 430).

The first program detecting circuit 24-1 compares a lock bit output from the sense amplifier 16 to generate the first comparison detecting signal DET1 (step 440). For example, the first program detecting circuit 24-1 compares whether data read from the lock bit region is "0" (or "1"). If the data is "0" (or "1"), the first comparison detecting signal DET1 is activated. If the data is "1", the first comparison detecting signal DET1 is inactivated.

The controller 26' determines whether the first comparison detecting signal DET1 is activated (step 450).

If the first comparison detecting signal DET1 is not activated, the controller 26' inactivates the write driver enable signal WDEN (step 460).

On the other hand, if the first comparison detecting signal DET1 is activated, the controller 26' activates the signal DIS2 (step 470).

The second program detecting circuit 24-2 compares data output from the sense amplifier 16 to generate the second comparison detecting signal DET2 (step 480). For example, the second program detecting circuit 24-2 is enabled in response to the signal DIS2 to compare whether data read from the OTP region are all "0" (or "1"). If the data are all "0" (or "1"), the second comparison detecting signal DET2 is activated. In other cases, the second comparison detecting signal DET2 is inactivated.

The controller 26' determines whether the second comparison detecting signal DET2 is activated (step 490).

If the second comparison detecting signal DET2 is not activated, the step 460 is performed. For example, the controller 26' inactivates the write driver enable signal WDEN.

On the other hand, if the second comparison detecting signal DET2 is activated, the controller 26' activates the write driver enable signal WDEN (step 500). Also, the step 500 is performed after the step 420.

Then, operation of the write driver 18 is enabled in response to a write driver enable signal WDEN, thereby writing data in the nonvolatile memory cell array 10' (step 510).

In the nonvolatile semiconductor memory device of FIG. 4, when the OTP region of the nonvolatile memory cell array 10' is selected and one bit or a predetermined bit of data is read, a lock bit data of the lock bit region is simultaneously selected to be output to the sense amplifier 16.

Also, when the OTP region is selected and one bit or a predetermined bit of data is read after the one-time programming is performed in the OTP region, one bit or a predetermined bit of data"0" (or "1") is stored "as is". In this case, the nonvolatile semiconductor memory device of FIG. 1 can not protect inherent data stored in the OTP region because the program detecting circuit activates a comparison detecting signal to enable the write driver enable signal WDEN. However, even in the ease that one bit or a predetermined bit of data "0" (or "1") is stored "as is", the nonvolatile semiconductor memory device of FIG. 4 can protect inherent data safely because the write driver enable signal WDEN is enabled only when the first comparison detecting circuit compares the lock bit to activate a first comparison detecting signal, and then the second comparison detecting circuit compares data stored in the OTP region to activate a second comparison detecting signal.

In accordance with at least one embodiment of the present invention, the one-time programming control method of the nonvolatile semiconductor memory device of the present invention can be applied to semiconductor memory devices having a nonvolatile memory cell array which perform a write operation and a read operation and do not need to perform an erase operation.

It should be appreciated that, in the nonvolatile semiconductor device described above, the program detecting circuit may be included in the control means.

As described herein before, the nonvolatile semiconductor memory device of the present invention and the one-time programming control method thereof, which do not need to perform an erase operation, can safely protect inherent data stored in the one-time programming region of a nonvolatile memory cell array.

While the invention has been particularly shown and described with reference to preferred embodiments thereof, it will be understood by those skilled in the ail that the foregoing and other changes in form and details may be made therein without departing from the spirit and scope of the invention.

What is claimed is:

1. A nonvolatile semiconductor memory device, comprising:
    a nonvolatile memory cell array having a one-time programming region accessed in response to a first decoding signal and a normal region accessed in response to a second decoding signal, wherein the nonvolatile memory cell array performs a read operation and a write operation;
    a data write circuit writing data in the nonvolatile memory cell array in response to a write driver enable signal during the write operation;
    a data read circuit reading data output from the nonvolatile memory cell array in response to a sense amplifier enable signal during the read operation; and
    a controller for activating the sense amplifier enable signal when the first decoding signal is generated and comparing data output from the data read circuit to generate the write driver enable signal during the write operation.

2. The device of claim 1, wherein new data is rewritten to the nonvolatile memory cell array without performing an erase operation.

3. The device of claim 1, wherein the controller comprises:
a program detecting circuit comparing data output from the data read circuit in response to a control signal to generate a comparison detecting signal; and
a control means for (a) inactivating the control signal when a specific mode signal is activated, (b) activating the control signal and the sense amplifier enable signal when the specific mode signal is inactivated and the first decoding signal is generated, and (c) activating the write driver enable signal when the comparison detecting signal is activated during the write operation.

4. The device of claim 3, wherein the control means activates the sense amplifier enable signal during the read operation.

5. The device of claim 3, wherein the program detecting circuit is enabled when the control signal is activated and is disabled when the control signal is inactivated, wherein when the control signal is activated, the comparison detecting signal is activated if data output from the data read circuit are all"0" (or "1").

6. The device of claim 1, wherein the one-time programming region is programmed with certain data.

7. A nonvolatile semiconductor memory device, comprising:
a nonvolatile memory cell array which has a one-time programming region and a lock bit region accessed in response to a first decoding signal and a normal region accessed in response to a second decoding signal, wherein the nonvolatile memory cell array performs a read operation and a write operation;
a data write circuit writing data in the nonvolatile memory cell array in response to a write driver enable signal during the write operation;
a data read circuit reading data output from the nonvolatile memory cell array in response to a sense amplifier enable signal during the read operation; and
a controller for, during the write operation, (a) activating the sense amplifier enable signal when the first decoding signal is generated, (b) comparing data of the lock bit region output from the data read circuit to generate a first comparison detecting signal, (c) comparing data of the one-time programming region output from the data read circuit to generate a second comparison detecting signal in response to a second comparison detecting signal, and (d) generating the write driver enable signal in response the first and second comparison detecting signals.

8. The device of claim 7, wherein new data is rewritten to the nonvolatile memory cell array without performing an erase operation.

9. The device of claim 7, wherein the data of the one-time programming region is read synchronously as the data of the lock bit region is output.

10. The device of claim 7, wherein the controller comprises:
a first program detecting circuit enabled in response to a first control signal to compare data of the lock bit region output from the data read circuit to thereby generate the first comparison detecting signal;
a second program detecting circuit enabled in response to a second control signal to compare data output from the data read circuit to thereby generate the second comparison detecting signal; and
a controller for, during the write operation, (a) inactivating the first and second control signals when a specific mode signal is activated, (b) activating the first and second control signals and the sense amplifier enable signal when the specific mode signal is inactivated and the first decoding signal is generated, and (c) activating the write driver enable signal when the first and second comparison detecting signals are activated.

11. The device of claim 10, wherein when the specific mode signal is inactivated, the controller (a) activates the first control signal and the sense amplifier enable signal when the first decoding signal is generated, (b) activates the second control signal when the first comparison detecting signal is activated, and (c) activates the write driver enable signal when the second comparison detecting signal is activated.

12. The device of claim 10, wherein the control means activates the sense amplifier enable signal during the read operation.

13. The device of claim 10, wherein the first program detecting circuit is enabled when the first control signal is activated and is disabled when the first control signal is inactivated, wherein when the first control signal is activated, the first comparison detecting signal is activated if data output from the data read circuit are all "0" (or "1").

14. The device of claim 10, wherein the second program detecting circuit is enabled when the second control signal is activated and is disabled when the second control signal is inactivated, wherein when the second control signal is activated, the second comparison detecting signal is activated if data output from the data read circuit are all "0" (or "1").

15. The device of claim 7, wherein the one-time programming region is programmed with certain data.

16. The device of claim 7, wherein the lock bit region is programmed with lock data, the lock data representing that the one-time programming region is programmed with certain data.

17. The device of claim 16, wherein the lock data comprises a single bit "0" or 1".

18. A one-time programming control method of a nonvolatile semiconductor memory device having a nonvolatile memory cell array which is divided into a one-time programming region and a normal region, wherein the nonvolatile semiconductor memory device performs a read operation and a write operation, the method comprising:
determining whether the one-time programming region is accessed during the write operation;
comparing data read from the one-time programming region to generate a comparison detecting signal when the one-time programming region is accessed;
stopping the write operation when the comparison detecting signal is not activated; and
writing data in the one-time programming region when the one-time programming region is not accessed or the comparison detecting signal is activated.

19. The method of claim 18, wherein new data is rewritten to the nonvolatile memory cell array without performing an erase operation.

20. The method of claim 18, wherein the one-time programming region is all programmed with certain data.

21. A one-time programming control method of a nonvolatile semiconductor memory device having a nonvolatile memory cell array which is divided into a one-time programming region, a lock bit region and a normal region, wherein the nonvolatile semiconductor memory device performs a read operation and a write operation, the method comprising:

determining whether the one-time programming region is accessed during the write operation;

comparing data read from the lock bit region to generate a first comparison detecting signal when the one-time programming region and the lock bit region are accessed, and comparing data read from the one-time programming region to generate a second comparison detecting signal when the first comparison detecting signal is generated;

stopping the write operation when the first or the second comparison detecting signal is not activated; and writing data in the one-time programming region when the one-time programming region and the lock bit region are not accessed or the second comparison detecting signal is activated.

22. The method of claim 21, wherein new data is rewritten to the nonvolatile memory cell array without performing an erase operation.

23. The method of claim 21, wherein the one-time programming region is all programmed with certain data.

* * * * *